(12) United States Patent
Sun

(10) Patent No.: US 7,026,653 B2
(45) Date of Patent: Apr. 11, 2006

(54) SEMICONDUCTOR LIGHT EMITTING DEVICES INCLUDING CURRENT SPREADING LAYERS

(75) Inventor: Decai Sun, Los Altos, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 105 days.

(21) Appl. No.: 10/766,277

(22) Filed: Jan. 27, 2004

(65) Prior Publication Data

US 2005/0161679 A1    Jul. 28, 2005

(51) Int. Cl.
*H01L 29/26*    (2006.01)
*H01L 27/15*    (2006.01)
*H01L 31/12*    (2006.01)
*H01L 33/00*    (2006.01)

(52) U.S. Cl. ............... 257/79; 257/13; 257/101; 257/102; 257/103; 257/918

(58) Field of Classification Search ............... 257/13, 257/79, 101–103, 918
See application file for complete search history.

(56) References Cited

U.S. PATENT DOCUMENTS

| | | | | |
|---|---|---|---|---|
| 4,371,968 A | * | 2/1983 | Trussell et al. ............... | 372/50 |
| 5,226,053 A | * | 7/1993 | Cho et al. ............... | 372/45 |
| 5,498,883 A | * | 3/1996 | Lebby et al. ............... | 257/95 |
| 5,614,734 A | * | 3/1997 | Guido ............... | 257/94 |
| 5,818,859 A | * | 10/1998 | Miller et al. ............... | 372/45.01 |
| 6,015,719 A | * | 1/2000 | Kish et al. ............... | 438/29 |
| 6,121,638 A | * | 9/2000 | Rennie et al. ............... | 257/103 |
| 6,222,205 B1 | * | 4/2001 | Geng et al. ............... | 257/96 |
| 6,720,570 B1 | * | 4/2004 | Lee et al. ............... | 257/14 |
| 6,829,271 B1 | * | 12/2004 | Sato et al. ............... | 372/44.01 |
| 2003/0089906 A1 | * | 5/2003 | Ueda ............... | 257/55 |
| 2003/0205717 A1 | * | 11/2003 | Khare et al. ............... | 257/103 |
| 2005/0045893 A1 | * | 3/2005 | Ludowise ............... | 257/79 |

OTHER PUBLICATIONS

D. A. Vanderwater et al., "High-Brightness AlGaInP Light Emitting Diodes", Proceedings of the IEEE, vol. 85, No. 11, Nov. 1997, pp. 1752-1764.

* cited by examiner

*Primary Examiner*—Ida M. Soward
(74) *Attorney, Agent, or Firm*—Patent Law Group LLP

(57) ABSTRACT

III-nitride or III-phosphide light emitting devices include a light emitting region disposed between a p-type region and an n-type region. At least one heavily doped layer is disposed within either the n-type region or the p-type region or both, to provide current spreading.

18 Claims, 6 Drawing Sheets

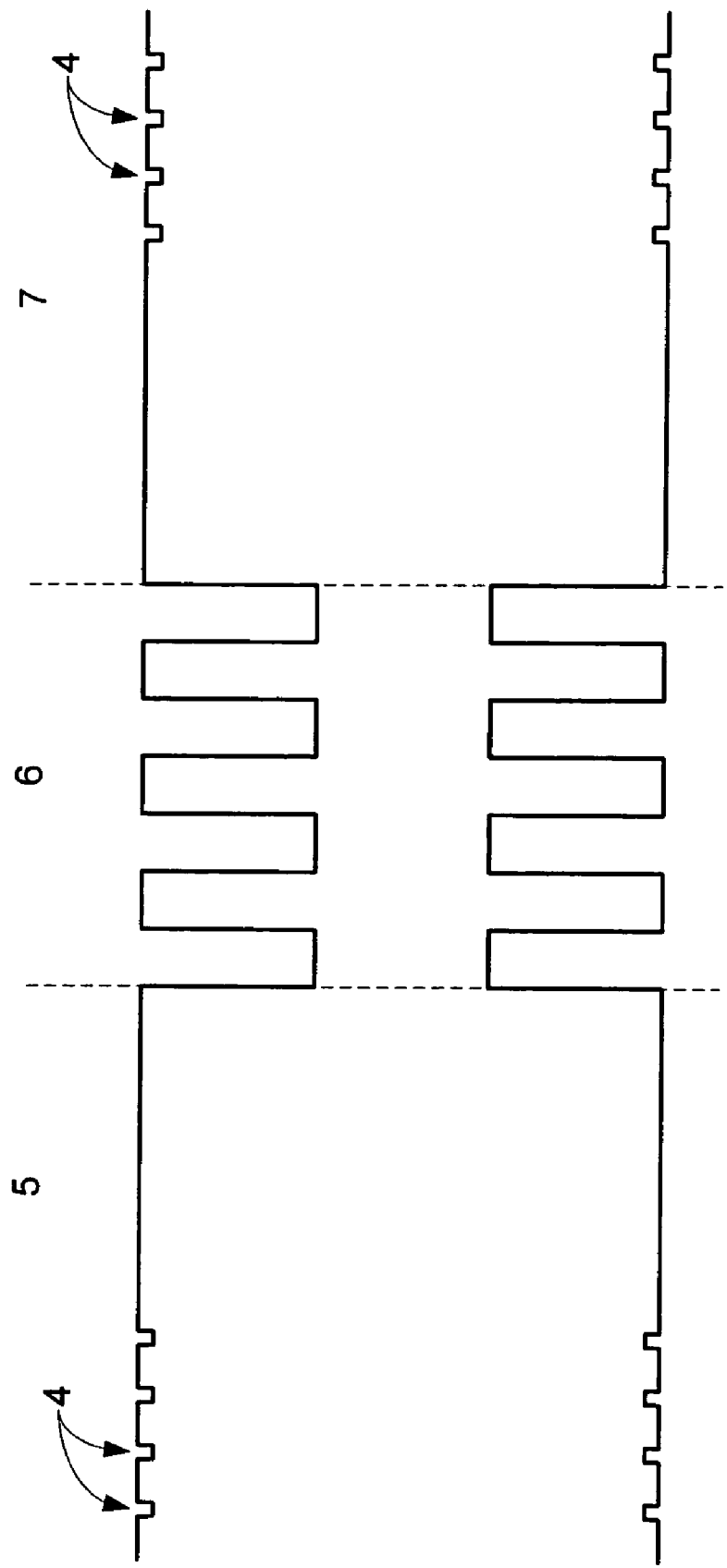

SEMICONDUCTOR LIGHT EMITTING DEVICES INCLUDING CURRENT SPREADING LAYERS

BACKGROUND

1. Field of Invention

The present invention is directed to semiconductor light emitting devices including heavily doped current spreading layers.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III–V semiconductors, particularly binary, ternary, and quaternary alloys of gallium, aluminum, indium, and nitrogen, also referred to as III-nitride materials; and binary, ternary, and quaternary alloys of gallium, aluminum, indium, and phosphorus, also referred to as III-phosphide materials. Such devices typically have a light emitting or active region sandwiched between a p-doped region and an n-doped region. Often III-nitride devices are epitaxially grown on sapphire, silicon carbide, or III-nitride substrates and III-phosphide devices are epitaxially grown on gallium arsenide by metal organic chemical vapor deposition (MOCVD) molecular beam epitaxy (MBE) or other epitaxial techniques.

Devices grown on a conductive substrate often have the contacts formed on opposite sides of the device. Alternatively, on devices grown on poorly conducting substrates, or for optical or electrical reasons, the device may be etched to expose portions of both the n- and p-type regions on the same side of the device. The contacts are then formed on the exposed regions. If the contacts are reflective and light is extracted from the side of the device opposite the contacts, the device is referred to as a flip chip. Since at least one of the contacts on a flip chip device does not directly overlie the active region, if current is not efficiently spread through the p- and n-type regions, device performance may suffer.

SUMMARY

In accordance with embodiments of the invention, III-nitride or III-phosphide light emitting devices include a light emitting region disposed between a p-type region and an n-type region. At least one heavily doped layer is disposed within either the n-type region or the p-type region or both, to provide current spreading.

BRIEF DESCRIPTION OF THE DRAWINGS

FIG. 2 is an energy band diagram for a portion of an embodiment of the invention.

DETAILED DESCRIPTION

One approach to improving current spreading in III-phosphide devices in particular is to increase the thickness of the epitaxial layers between the contacts. Thick epitaxial layers generally increase the cost of producing a device and the amount of light lost to absorption. In addition, in a flip chip device, the need to etch to expose portions of buried layers in order to form contacts limits the thickness with which certain device layers can be grown.

Figure 1A:
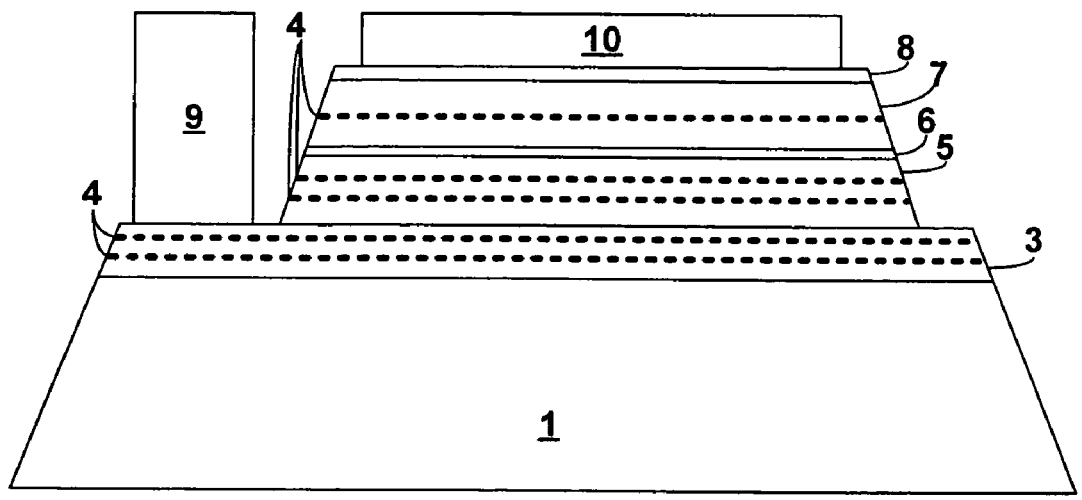
FIG. 1A is a cross sectional view of a III-phosphide flip chip LED according to an embodiment of the invention.

In accordance with an embodiment of the invention, a III-phosphide flip chip device includes one or more highly doped layers. The highly doped layers spread current laterally within the device without increasing the thickness of the epitaxial layers in the device. FIG. 1A is a cross sectional view of a III-phosphide flip chip LED. The device of FIG. 1A includes an active region 6 sandwiched between a p-doped cladding region 5 and an n-doped cladding region 7. The wavelength of light emitted by the active region may be controlled by selecting the width and composition of the layers in active region 6, as is known in the art. An example of a suitable active region includes 3 or 4 quantum wells separated by barrier layers. An n-contact layer 8 separates n-contact 10 from the n-doped cladding region 7. A p-contact 9 is formed on a p-doped current spreading layer 3. Light is extracted from the device through an undoped, transparent GaP window layer 1. The table below gives examples of the thickness, composition, and dopant appropriate for each of layers 3, 5, 6, 7, and 8.

| | |
|---|---|
| P-doped current spreading region 3 | 1–10 micron thick layer of Mg doped GaP |
| P-doped cladding region 5 | 0.5–2 micron thick layer of Mg doped AlInP |
| Quantum wells of active region 6 | 80–300 angstrom thick layers of undoped InGaP |
| Barrier layers of active region 6 | 100–150 angstrom thick layers of undoped $(Al_xGa_{1-x})_{0.5}In_{0.5}P$, x~0.65 |
| N-doped cladding region 7 | 0.5–2 micron thick layer of Te doped AlInP |
| N-doped contact region 8 | 500 angstrom thick layer of Te doped GaInP |

The characteristics given below for each layer are examples and are not meant to be limiting. For example, other p- and n-type dopants, such as Zn or Si, may be used. More information on selecting the appropriate characteristics of the layers of the device may be found in chapters 1–3 of Semiconductors and Semimetals, Volume 64, Electroluminescence I, Academic Press, San Francisco, 2000, Gerd Mueller, ed., which is incorporated herein by reference.

Figure 1B:
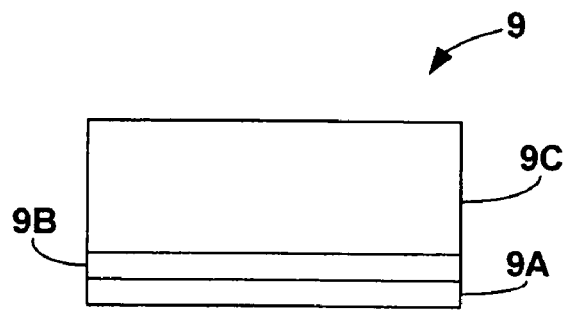
FIG. 1B illustrates a p-contact for the device illustrated in FIG. 1A.
Figure 1C:
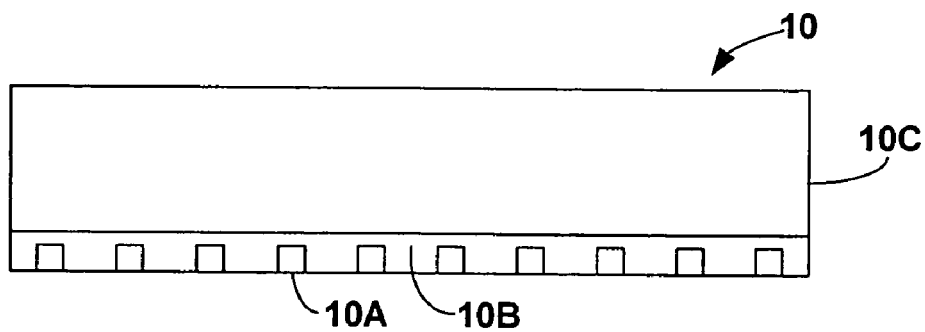
FIG. 1C illustrates an n-contact for the device illustrated in FIG. 1A.

P-contact 9 and n-contact 10 of FIG. 1A may be multilayer structures, as illustrated in FIGS. 1B and 1C. FIG. 1B illustrates an example of a multilayer p-contact 9. A layer of Au—Zn alloy 9A is formed adjacent to current spreading layer 3, in order to provide ohmic contact to the semiconductor layer. Au—Zn layer 9A may be protected by an optional guard metal layer 9B of, for example, a sandwich of TiW, TiW:N, and TiW. A thick contact layer 9C, such as gold, is then formed over guard layer 9B. The ohmic layer 9A and guard layer 9B may cover all or just a portion of the semiconductor layer 3 on which p-contact 9 is formed.

A multilayer n-contact 10 may have a similar structure, as illustrated in FIG. 1C. A layer of Au—Ge alloy 10A is fanned adjacent to contact layer 8, in order to provide ohmic contact to the semiconductor layer. Au—Ge layer 10A may be protected by an optional guard metal layer 10B of, for example, a sandwich of TiW, TiW:N, and TiW. A thick reflective layer 10C of Au is deposited over layers 10A and 10B. Ohmic layer 10A is generally not very reflective, and is thus often formed as dots (as in FIG. 1C) or thin stripes that cover a small fraction of the semiconductor layer 8 on which n-contact 10 is formed.

Heavily doped layers 4 (represented as thick dashed lines in FIG. 1A) may be included in one or more of p-doped contact layer 3, p-doped cladding layer 5, and n-doped cladding layer 7. Heavily doped layers 4 are formed in regions of the device that may benefit from additional current spreading. In the device illustrated in FIG. 1A, p-contact 9 does not directly overlie the active region, thus current is required to spread from p-contact 9 to the active region. Accordingly, the p-type side of active region 6 may benefit from additional current spreading and may thus include heavily doped layers 4. If n-contact 10 is a sheet contact, n-contact 10 overlies the entire active region and additional current spreading is not required on the n-type side of active region 6. If n-contact 10 includes small regions of ohmic layers 10A and a large reflective sheet 10G as illustrated in FIG. 1C, current is required to spread from ohmic contact regions 10A to the areas of semiconductor layer 8 under reflective sheet 10C without an ohmic contact region 10A. In such devices, the n-type side of active region 6 may benefit from additional current spreading and may thus include heavily doped layers 4.

Highly doped layers 4 are doped with the same conductivity type as the region in which they are formed. For example, highly doped layers 4 within n-type regions of the device are n-type, and highly doped regions 4 within p-type regions are p-type. Typically, highly doped layers 4 are doped with the same dopant species as the surrounding region, though this is not required. Highly doped layers 4 may be doped to a concentration of about $5 \times 10^{18}$ to about $1 \times 10^{19}$ cm$^{-3}$. In contrast, n-doped cladding region 7, p-doped cladding region 5, and p-doped current spreading layer 3 are usually doped to a concentration of about $5 \times 10^{17}$ to about $1 \times 10^{18}$ cm$^{-3}$.

Due to the high dopant concentration, highly doped layers 4 will tend to absorb light. Accordingly, highly doped layers 4 are usually thin, for example between about 10 and 100 nm thick, and positioned as far from the active region of the device as possible. Multiple highly doped layers 4 may be formed in a single region. In such embodiments, the highly doped layers are usually spaced at least 10 nm apart and the total thickness of all the highly doped layers is between about 100 and about 500 nm.

In some embodiments, highly doped layers 4 are the same composition as the regions in which they are disposed. In other embodiments, highly doped layers 4 are quaternary AlInGaP layer having a lower band gap than the regions in which they are disposed, for example $(Al_xGa_{1-x})_{0.5}In_{0.5}P$ where $0.2 < x < 0.7$. In general, the smaller the band gap of a material, the more highly the material can be doped without sacrificing crystal quality, thus the use of quaternary alloys for heavily doped layers 4 may permit these layers to be more heavily doped. In addition, the small regions of lower band gap created by the quaternary heavily doped layers may further encourage lateral current spreading by creating vertical potential barriers.

FIG. 2 illustrates a portion of an energy band diagram for an example of a III-phosphide device incorporating heavily doped layers. Each of cladding layers 5 and 7 includes four heavily doped layers 4. Cladding layers 5 and 7 each have a total thickness of about one micron. Heavily doped layers 4 are each about 50 nm thick, and separated by about 100 nm. Because of the absorptive nature of heavily doped layers 4, these layers are located in the portions of cladding layers 5 and 7 furthest from active region 6. Heavily doped layers are $(Al_{0.65}Ga_{0.35})_{0.5}In_{0.5}P$ doped to a concentration of about $5 \times 10^{18}$ cm$^{-3}$.

Figure 3:
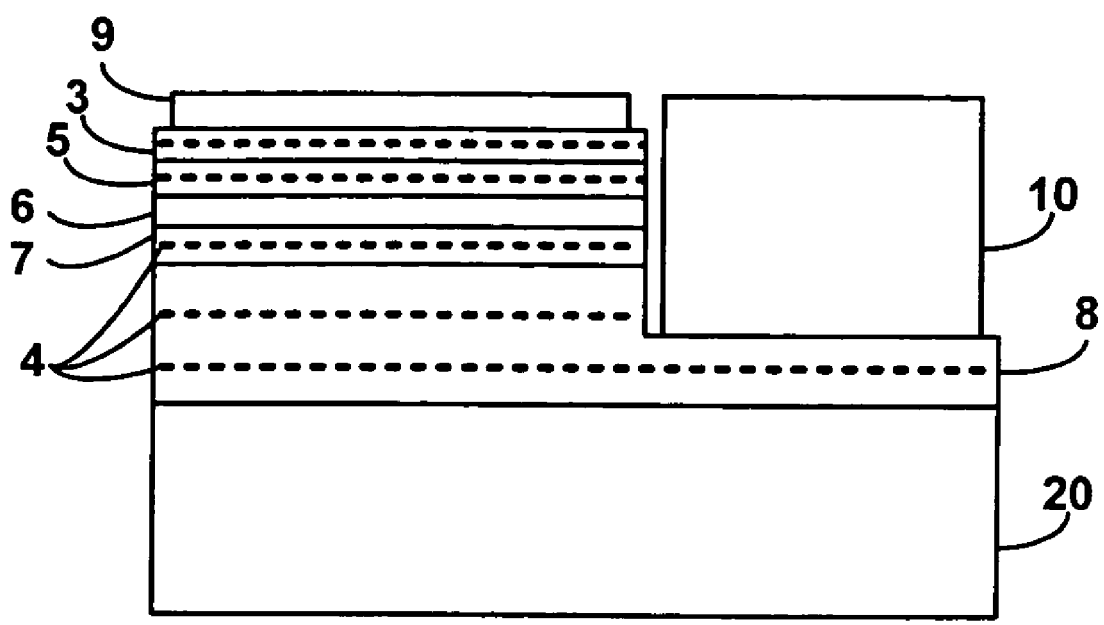
FIG. 3 is a cross sectional view of a III-nitride flip chip LED according to an embodiment of the invention.

Heavily doped current spreading layers may also be used in III-nitride light emitting devices. FIG. 3 is a cross sectional view of a III-nitride flip chip device including heavily doped layers. In the device of FIG. 3, an n-contact layer 8 is grown over a growth substrate 20 and optional nucleation layers (not shown), followed by an n-type cladding layer 7, active region 6, p-type cladding layer 5, and p-type contact layer 3. As in the device of FIG. 1A, the wavelength of light emitted by the active region may be controlled by selecting the width and composition of the layers in active region 6, as is known in the art. An example of a suitable active region includes 3 or 4 quantum wells separated by barrier layers. N-contact 10 is formed on a portion of n-contact layer 8 exposed by etching. A p-contact 9 is formed on p-doped contact layer 3. Both n-contact 10 and p-contact 9 are reflective and light is extracted from the device through substrate 20. The table below gives examples of the thickness, composition, and dopant appropriate for each of layers 3, 5, 6, 7, and 8.

| | |
|---|---|
| P-doped contact region 3 | 0.3–0.7 micron thick layer of Mg doped GaN |
| P-doped cladding region 5 | 0.05–0.25 micron thick layer of Mg doped AlGaN |
| Quantum wells of active region 6 | 100–150 angstrom thick layers of undoped InGaN or AlInGaN |
| Barrier layers of active region 6 | 50–150 angstrom thick layers of undoped GaN or InGaN |
| N-doped cladding region 7 and contact region 8 | 2–6 micron thick layer of Si doped GaN |

The characteristics given below for each layer are examples and are not meant to be limiting.

As in the embodiment described in FIG. 1A, in the device illustrated in FIG. 3 heavily doped layers 4 may be formed in one or more of p-doped contact layer 3, p-doped cladding region 5, n-doped cladding region 7, and n-doped contact layer 8. In the device illustrated in FIG. 3, p-contact is usually a sheet contact which provides sufficient current spreading on the p-type side of active region 6. Accordingly, in III-nitride devices, heavily doped layers 4 are often formed on the n-type side of active region 6 only. Heavily doped layers 4 in FIG. 3 may be GaN layers, quaternary AlInGaN layers, or may be layers of the same composition as the region in which they are located. Heavily doped layers may have the same thickness, location relative to the active region, and dopant concentration as described above in the text accompanying FIG. 1A.

Figure 4A:
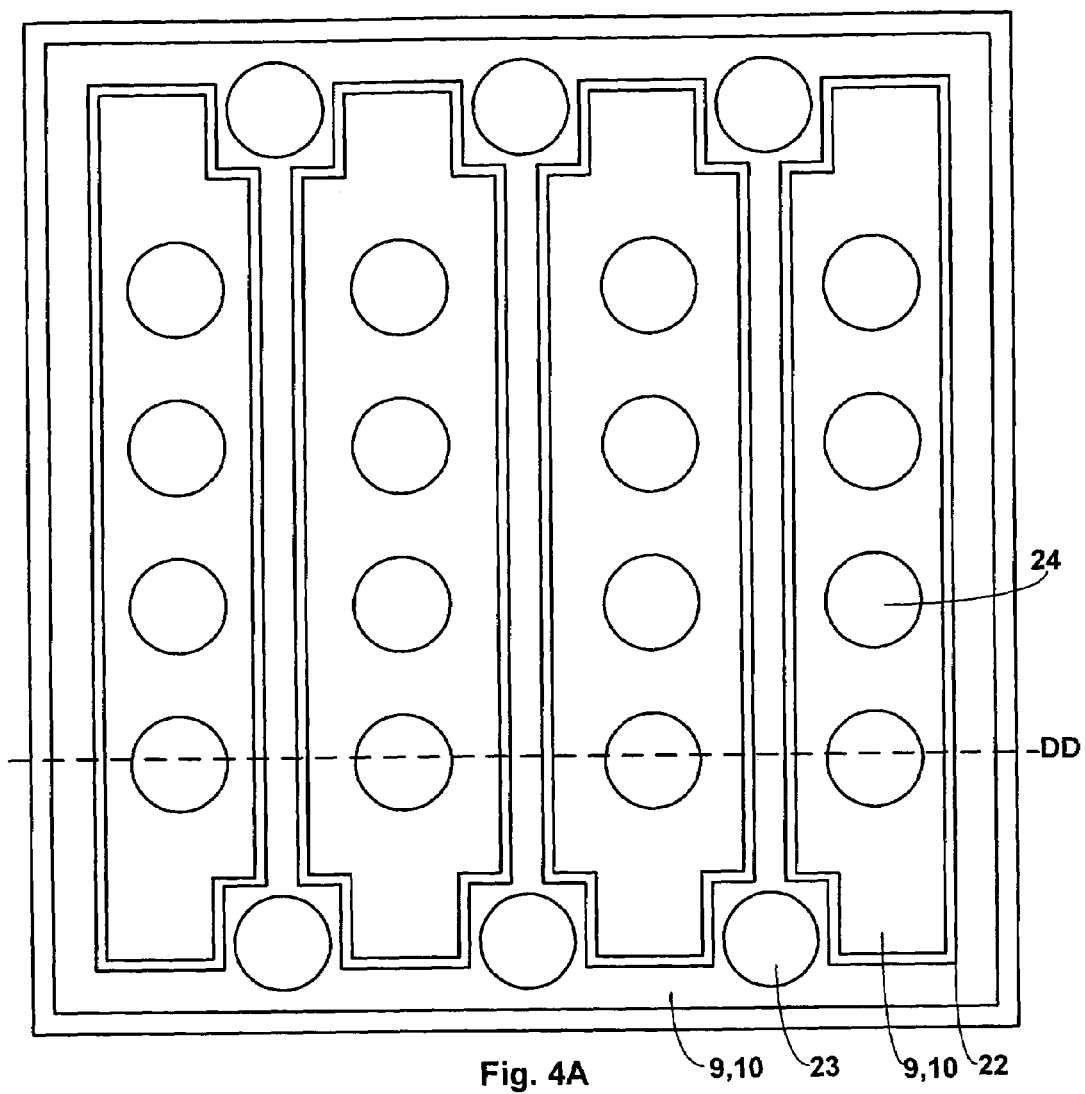
FIGS. 4A and 4B are a plan view and a cross sectional view of a contacting scheme for a large junction flip chip LED.
Figure 4B:
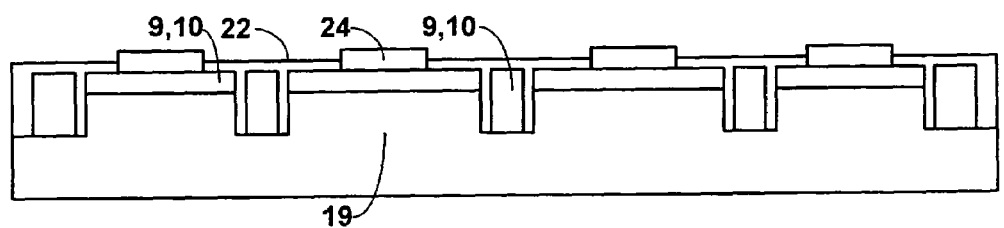

FIGS. 4A and 4B illustrate an arrangement of contacts 9 and 10 for a large junction device (that is, a device having an area greater than about 400×400 μm$^2$) according to FIG. 1A or 3. FIG. 4A is a plan view and FIG. 4B is a cross section taken along line DD. Layers 19 include layers 1, 3, 4, 5, 6, 7, and 8 of FIG. 1A or layers 20, 7, 8, 6, 5, 3, and 4 of FIG. 3. The active region is divided into four isolated regions, in order to minimize the distance between the p- and n-contacts. The contact that is deposited on a layer exposed by etching, i.e. p-contact 9 in the device of FIG. 1A, and n-contact 10 in the device of FIG. 3, surrounds and interposes the four regions. N-contacts 10 in the device of FIG. 1A, and p-contacts 9 in the device of FIG. 3 are formed on the four active regions. P- and n-contacts 9 and 10 are electrically isolated from each other by air or by optional insulating layer 22. Six submount connections 23 and sixteen submount connections 24 are deposited on the p- and n-contacts to form a surface suitable for connecting the device to a submount. The submount is often a silicon integrated circuit attached to the device by solder joints. In such embodiments, the p- and n-submount connections may be, for example, solderable metals. In other embodiments, the device is connected to the submount by gold bonds, cold welding, or thermocompression bonding.

Figure 5A:
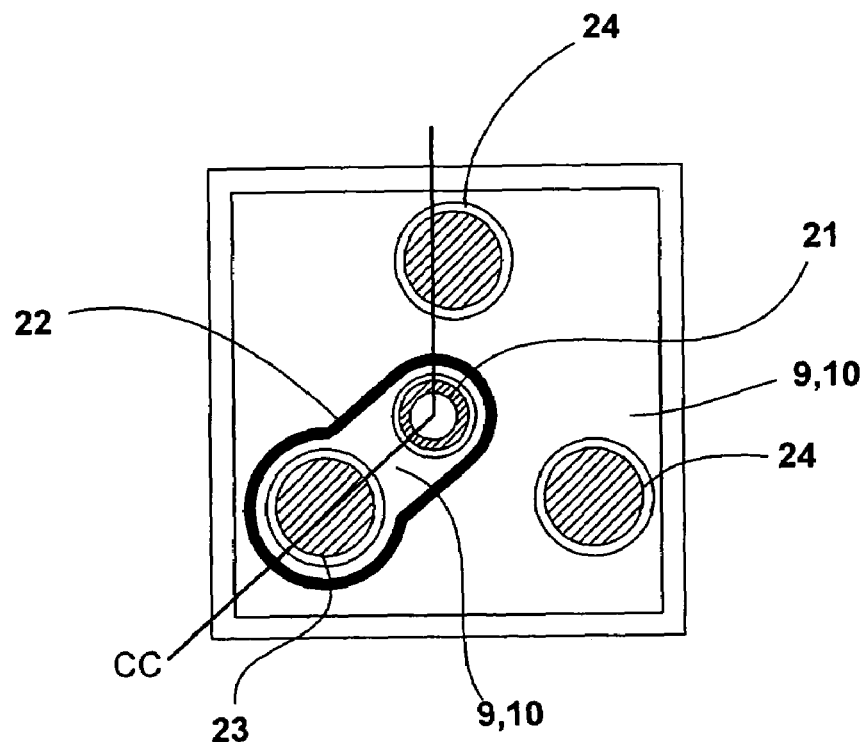
FIGS. 5A and 5B are a plan view and a cross sectional view of a contact scheme for a small junction flip chip LED.
Figure 5B:
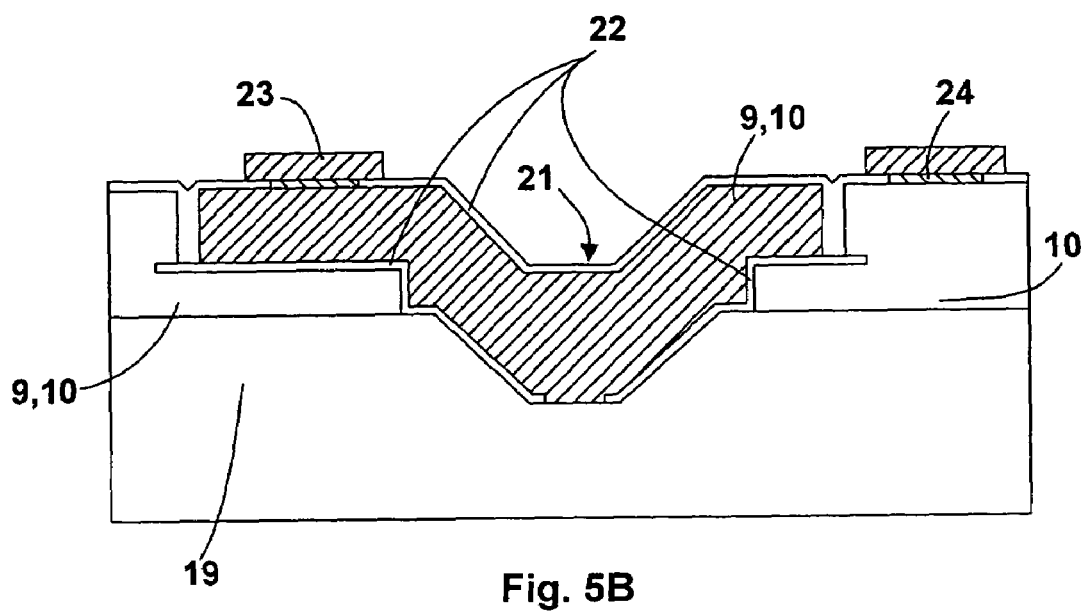

FIGS. 5A and 5B illustrate an arrangement of contacts 9 and 10 for a small junction device (that is, a device having an area less than about 400×400 μm$^2$) according to FIG. 1A or 3. FIG. 5A is a plan view and FIG. 5B is a cross section taken along line CC. Layers 19 include layers 1, 3, 4, 5, 6, 7, and 8 of FIG. 1A or layers 20, 7, 8, 6, 5, 3, and 4 of FIG. 3. The device shown in FIGS. 5A and 5B has a single via 21 etched down to a layer of the epitaxial structure below the active region. A p-contact 9 in the device of FIG. 1A, and an n-contact 10 in the device of FIG. 3, is deposited in via 21. Via 21 is located at the center of the device to provide uniform current and light emission. An n-contact 10 in the device of FIG. 1A and a p-contact 9 in the device of FIG. 3 surrounds the via and provides electrical contact to the other side of the active region of the epitaxial structure. The p- and n-contacts are separated and electrically isolated by one or more dielectric layers 22, or by air. Two submount connections 24 and one submount connection 23 are disposed on p- and n-contacts 9 and 10. Submount connection 23 may be located anywhere within the region surrounded by insulating layer 22 and need not necessarily be located directly over via 21. Similarly, submount connections 24 may be located anywhere in the region outside insulating layer 22. As a result, the connection of the device to a submount is not limited by the shape or placement of p-contact 9 and n-contact 10.

Figure 6:
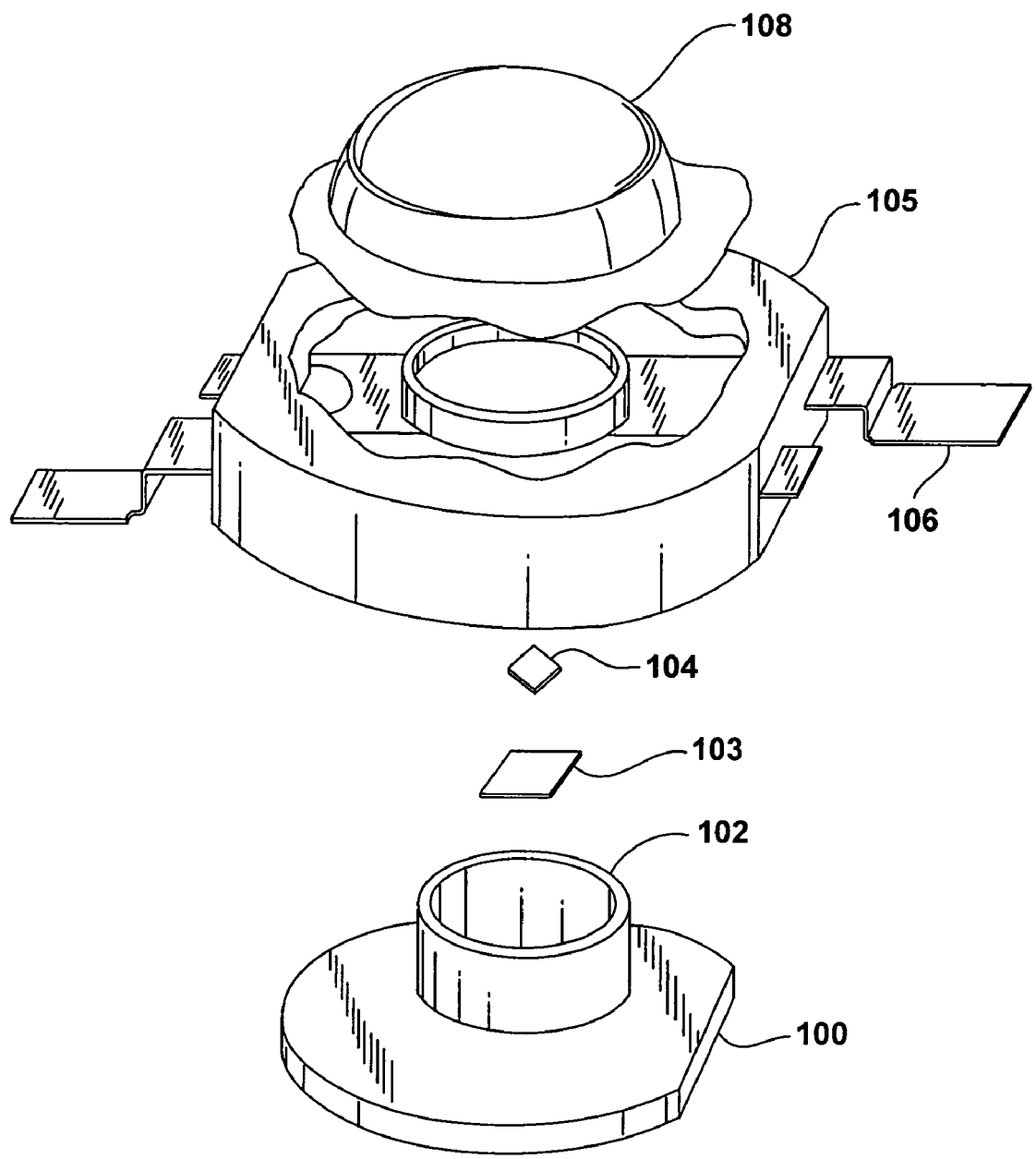
FIG. 6 is an exploded view of a packaged semiconductor light emitting device.

FIG. 6 is an exploded view of a packaged light emitting device. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A semiconductor light emitting device comprising:
   a light emitting region disposed between a cladding region of first conductivity type and a cladding region of second conductivity type;
   a contact region of first conductivity type adjacent to the cladding region of first conductivity type;
   a contact region of second conductivity type adjacent to the cladding region of second conductivity type; and
   at least one heavily doped layer disposed within the cladding region of first conductivity type, wherein the heavily doped layer is more heavily doped than the cladding region of first conductivity type.

2. The device of claim 1 wherein the light emitting region comprises at least one layer of InGaP.

3. The device of claim 1 wherein the light emitting region comprises at least one layer of InGaN.

4. The device of claim 1 further comprising a plurality of heavily doped layers disposed within the cladding region of first conductivity type.

5. The device of claim 4 wherein:
   each of the plurality of heavily doped layers is between about 10 nm and about 100 nm thick; and
   the plurality of heavily doped layers are separated by at least 10 nm of cladding region of first conductivity type.

6. The device of claim 4 wherein a total thickness of the plurality of heavily doped layers is between about 100 nm and about 500 nm.

7. The device of claim 1 wherein:
   the cladding region of first conductivity type has a dopant concentration between about $5\times10^{17}$ and about $1\times10^{18}$ cm$^{-3}$; and
   the heavily doped layer has a dopant concentration between about $1\times10^{18}$ and about $1\times10^{19}$ cm$^{-3}$.

8. The device of claim 1 wherein the heavily doped layer comprises $(Al_xGa_{1-x})_{0.5}In_{0.5}P$, where $0<x\geq1$.

9. The device of claim 8 wherein the heavily doped layer comprises $(Al_xGa_{1-x})_{0.5}In_{0.5}P$, where $0.2<x<0.7$.

10. The device of claim 8 wherein the heavily doped layer comprises $(Al_{0.65}Ga_{0.35})_{0.5}In_{0.5}P$.

11. The device of claim 1 wherein the heavily doped layer comprises $Al_xIn_yGa_zN$, where $0<x\leq1$, $0<y\leq1$, and $0<z\leq1$.

12. The device of claim 1 wherein the heavily doped layer comprises GaN.

13. The device of claim 1 wherein the heavily doped layer is a first heavily doped layer, the device further comprising a second heavily doped layer disposed within the cladding region of second conductivity type, wherein the second heavily doped layer is more heavily doped than the cladding region of second conductivity type.

14. The device claim 1 wherein the heavily doped layer is a first heavily doped layer disposed within the cladding region of first conductivity type, the device further comprising a second heavily doped layer disposed within the contact region of first conductivity type, wherein the second heavily doped layer is more heavily doped than the contact region of first conductivity type.

15. The device claim 1 wherein the heavily doped layer is a first heavily doped layer disposed within the cladding region of first conductivity type, the device further comprising a second heavily doped layer disposed within the contact region of first conductivity type, wherein the second heavily doped layer is more heavily doped than the contact region of first conductivity type.

16. The device of claim 1 further comprising:
   a first lead electrically connected to the cladding region of first conductivity type;

a second lead electrically connected to the cladding region of second conductivity type; and a cover disposed over the light emitting region.

17. A semiconductor light emitting device comprising:

a light emitting region disposed between a cladding region of first conductivity type and a cladding region of second conductivity type;

a contact region of first conductivity type adjacent to the cladding region of first conductivity type;

a contact region of second conductivity type adjacent to the cladding region of second conductivity type;

at least one heavily doped layer disposed within the contact region of first conductivity type, wherein the heavily doped layer is more heavily doped than the contact region of first conductivity type;

wherein:

the contact region of first conductivity type is spaced apart from the light emitting region by the cladding region of first conductivity type; and the contact region of second conductivity type is spaced apart from the light emitting region by the cladding region of second conductivity type.

18. The device of claim 17 the heavily doped layer is a first heavily doped layer disposed within the contact region of first conductivity type, the device further comprising a second heavily doped layer disposed within the contact region of second conductivity type, wherein the second heavily doped layer is more heavily doped than the contact region of second conductivity type.

* * * * *

UNITED STATES PATENT AND TRADEMARK OFFICE
CERTIFICATE OF CORRECTION

PATENT NO.         : 7,026,653 B2                                      Page 1 of 1
APPLICATION NO. : 10/766277
DATED              : April 11, 2006
INVENTOR(S)        : Decai Sun It is certified that error appears in the above-identified patent and that said Letters Patent is hereby corrected as shown below:

Column 6, line 34, claim 8: Cancel "$0<x\geq1$." and substitute

--$0<x\leq1$.--.

Column 6, line 50, claim 14: Between the words "device" and "claim 1" please insert --of--.

Column 6, line 58, claim 15: Between the words "device" and "claim 1" please insert --of--.

Column 6, line 62, claim 15: Cancel "first" and substitute

--second--.

Column 6, line 64, claim 15: Cancel "first" and substitute

--second--.

Signed and Sealed this

Twenty-eighth Day of November, 2006

JON W. DUDAS
*Director of the United States Patent and Trademark Office*